US012698419B2

(12) United States Patent
Lee et al.

(10) Patent No.: US 12,698,419 B2
(45) Date of Patent: Aug. 4, 2026

(54) TEMPERATURE-CHANGEABLE ADHESIVE SHEET AND TEMPERATURE-CHANGEABLE ADHESIVE SHEET MANUFACTURING METHOD USING SAME

(71) Applicant: LG Chem, Ltd., Seoul (KR)

(72) Inventors: Hui Je Lee, Daejeon (KR); Yoonkyung Kwon, Daejeon (KR); Hyun Jee Yoo, Daejeon (KR); Kyung Yul Bae, Daejeon (KR)

(73) Assignee: XINMEI FONTANA HOLDING (HONG KONG) LIMITED, Hong Kong (CN)

( * ) Notice: Subject to any disclaimer, the term of this patent is extended or adjusted under 35 U.S.C. 154(b) by 123 days.

(21) Appl. No.: 16/753,235

(22) PCT Filed: Jan. 11, 2019

(86) PCT No.: PCT/KR2019/000481
§ 371 (c)(1),
(2) Date: Apr. 2, 2020

(87) PCT Pub. No.: WO2019/139418
PCT Pub. Date: Jul. 18, 2019

(65) Prior Publication Data
US 2020/0325361 A1      Oct. 15, 2020

(30) Foreign Application Priority Data

Jan. 11, 2018    (KR) ........................ 10-2018-0003961

(51) Int. Cl.
*C09J 7/29*        (2018.01)
*C08K 5/00*        (2006.01)
(Continued)

(52) U.S. Cl.
CPC .............. *C09J 7/29* (2018.01); *C08K 5/0025* (2013.01); *C08K 5/01* (2013.01); *C08L 9/00* (2013.01);
(Continued)

(58) Field of Classification Search
None
See application file for complete search history.

(56) References Cited

U.S. PATENT DOCUMENTS

| | | | |
|---|---|---|---|
| 2003/0198807 A1 | 10/2003 | Banba et al. | |
| 2009/0026934 A1 | 1/2009 | Fujita et al. | |

(Continued)

FOREIGN PATENT DOCUMENTS

| | | |
|---|---|---|
| CN | 102985255 A | 3/2013 |
| CN | 103998549 A | 8/2014 |

(Continued)

OTHER PUBLICATIONS

JP2004269564 English Machine Translation.*

(Continued)

*Primary Examiner* — Frank D Ducheneaux
(74) *Attorney, Agent, or Firm* — Ricky Lam

(57) ABSTRACT

A temperature-variable adhesive sheet, and a method for manufacturing a temperature-variable adhesive sheet using the same are provided. The adhesive sheet includes a first adhesive layer and a second adhesive layer consecutively provided on a barrier film, wherein initial adhesive strength between the second adhesive layer and a SUS304 substrate is 200 gf/in or less, and adhesive strength, after 20 minutes passed under a condition of 50° C. and 5 atmospheres, is 400 gf/in or greater.

5 Claims, 1 Drawing Sheet

| |
|---|
| 600 |
| 500 |
| 400 |
| 300 |
| 200 |
| 100 |

(51) Int. Cl.

| | |
|---|---|
| *C08K 5/01* | (2006.01) |
| *C08L 9/00* | (2006.01) |
| *C08L 33/08* | (2006.01) |
| *C08L 83/04* | (2006.01) |
| *C09J 7/20* | (2018.01) |
| *C09J 7/38* | (2018.01) |
| *C09J 11/06* | (2006.01) |
| *C09J 109/00* | (2006.01) |
| *C09J 123/16* | (2006.01) |
| *C09J 133/08* | (2006.01) |
| *C09J 133/10* | (2006.01) |
| *C09J 183/04* | (2006.01) |
| *H10K 50/844* | (2023.01) |

(52) U.S. Cl.

CPC .............. *C08L 33/08* (2013.01); *C08L 83/04* (2013.01); *C09J 7/20* (2018.01); *C09J 7/383* (2018.01); *C09J 11/06* (2013.01); *C09J 109/00* (2013.01); *C09J 123/16* (2013.01); *C09J 133/08* (2013.01); *C09J 133/10* (2013.01); *C09J 183/04* (2013.01); *B32B 2307/7246* (2013.01); *C08L 2205/00* (2013.01); *C09J 2203/326* (2013.01); *C09J 2301/208* (2020.08); *C09J 2301/302* (2020.08); *C09J 2301/312* (2020.08); *C09J 2301/408* (2020.08); *C09J 2409/00* (2013.01); *C09J 2423/00* (2013.01); *C09J 2433/00* (2013.01); *C09J 2483/00* (2013.01); *H10K 50/844* (2023.02)

(56) References Cited

U.S. PATENT DOCUMENTS

2012/0003484 A1    1/2012    Roehrig et al.

| | | | | |
|---|---|---|---|---|
| 2012/0231245 | A1* | 9/2012 | Kim .......................... | G06F 1/16 |
| | | | | 428/483 |
| 2013/0085250 | A1 | 4/2013 | Nakanishi et al. | |
| 2014/0017467 | A1 | 1/2014 | Inao et al. | |
| 2014/0150962 | A1 | 6/2014 | Rule et al. | |
| 2014/0356567 | A1 | 12/2014 | Park | |
| 2015/0299523 | A1 | 10/2015 | Park et al. | |
| 2017/0081557 | A1* | 3/2017 | Shigetomi .............. | C09J 183/04 |

FOREIGN PATENT DOCUMENTS

| | | | | |
|---|---|---|---|---|
| JP | 2002166401 | A | | 6/2002 |
| JP | 2004269564 | A | * | 9/2004 |
| KR | 20080088606 | A | | 10/2008 |
| KR | 20130036158 | A | | 4/2013 |
| KR | 20130040235 | A | | 4/2013 |
| KR | 20140035346 | A | | 3/2014 |
| KR | 20140142026 | A | | 12/2014 |
| KR | 20150039714 | A | | 4/2015 |
| KR | 20160022771 | A | | 3/2016 |
| KR | 20160041708 | A | | 4/2016 |
| KR | 101645092 | B1 | | 8/2016 |
| TW | 201213116 | A | | 4/2012 |
| TW | 201412919 | A | | 4/2014 |

OTHER PUBLICATIONS

Search report from International Application No. PCT/KR2019/000481, mailed Apr. 15, 2019.

Search Report from Office Action from Tawain Application No. 108101195, dated Sep. 17, 2019.

Chinese Search Report for Application No. 201980004875.X, dated Jun. 7, 2021, 2 pages.

* cited by examiner

| |
|:---:|
| 600 |
| 500 |
| 400 |
| 300 |
| 200 |
| 100 |

TEMPERATURE-CHANGEABLE ADHESIVE SHEET AND TEMPERATURE-CHANGEABLE ADHESIVE SHEET MANUFACTURING METHOD USING SAME

CROSS-REFERENCE TO RELATED APPLICATIONS

This application claims priority to and the benefits of Korean Patent Application No. 10-2018-0003961, filed with the Korean Intellectual Property Office on Jan. 11, 2018, the entire contents of which are incorporated herein by reference.

TECHNICAL FIELD

The present specification relates to a temperature-variable adhesive sheet, and a method for manufacturing a temperature-variable adhesive sheet using the same.

BACKGROUND OF THE INVENTION

An organic electronic device (OED) means a device comprising an organic material layer in which an exchange of charges occurs using holes and electrons, and examples thereof may comprise a photovoltaic device, a rectifier, a transmitter, an organic light emitting diode (OLED) and the like.

Among the organic electronic devices, an organic light emitting diode (OLED) has lower power consumption, faster response time, and is advantageous for thinning of display device and illumination compared to existing light sources. In addition, an OLED has excellent space utilization, and is expected to be used in various fields covering various portable devices, monitors, notebooks and TVs.

In commercializing and expanding applications of an OLED, the main problem is durability. Organic materials and metal electrodes included in an OLED are very readily oxidized by external factors such as moisture. Accordingly, products comprising an OLED are highly sensitive to environmental factors. Accordingly, various methods have been proposed in order to effectively block penetration of oxygen, moisture or the like from the outside into an organic electronic device such as an OLED.

Patent Document 1 (Korean Patent Application Laid-Open Publication No. 2008-0088606) relates to an adhesive encapsulating composition film and an organic electroluminescent device, and the adhesive is based on polyisobutylene (PIB), and has poor processability and poor reliability under a high temperature and high humidity condition.

Accordingly, development of encapsulant capable of maintaining reliability under a high temperature and high humidity condition and having excellent optical properties and reworkability while securing a required lifetime and effectively blocking penetration of moisture in an organic electronic device has been required.

BRIEF SUMMARY OF THE INVENTION

The present specification is directed to providing a temperature-variable adhesive sheet, and a method for manufacturing a temperature-variable adhesive sheet using the same.

One embodiment of the present specification provides an adhesive sheet in which a first adhesive layer and a second adhesive layer are consecutively provided on a barrier film, wherein initial adhesive strength of the second adhesive layer with a SUS304 substrate after coating and then drying for 20 minutes is 200 gf/in or less, and adhesive strength after 20 minutes pass under a condition of 50° C. and 5 atmospheres is 400 gf/in or greater.

Another embodiment of the present specification provides an organic electronic device encapsulation product comprising the adhesive sheet described above.

Still another embodiment of the present specification provides a method for manufacturing an adhesive sheet comprising preparing a barrier film; and forming the adhesive sheet descried above on the barrier film.

Advantageous Effects

An adhesive sheet according to one embodiment of the present specification has an advantage of, while maintaining properties of existing adhesive sheets such as adhesion properties, allowing rework when incorrectly attached due to low initial adhesive strength.

BRIEF DESCRIPTION OF THE DRAWING

FIG. 1 illustrates an adhesive sheet according to one embodiment of the present specification.

DETAILED DESCRIPTION OF THE INVENTION

In the present specification, a description of a certain member being placed "on" another member comprises not only a case of the one member adjoining the another member but a case of still another member being present between the two members.

In the present specification, a description of a certain part "including" certain constituents means capable of further comprising other constituents, and does not exclude other constituents unless particularly stated on the contrary.

Hereinafter, the present specification will be described in more detail.

One embodiment of the present specification provides an adhesive sheet in which a first adhesive layer and a second adhesive layer are consecutively provided on a barrier film, wherein initial adhesive strength of the second adhesive layer with a SUS304 substrate is 200 gf/in or less, and adhesive strength after 20 minutes pass under a condition of 50° C. and 5 atmospheres is 400 gf/in or greater.

According to one embodiment of the present specification, the barrier film may have a structure in which a base layer, a planarization layer and a barrier layer are laminated.

According to one embodiment of the present specification, the first adhesive layer may be provided on the barrier layer of the barrier film.

In one embodiment of the present application, the barrier film may comprise various inorganic barrier materials, and examples of the inorganic barrier material may comprise at least one type of metal selected from the group consisting of silicon (Si), aluminum (Al), indium (In), tin (Sn), zinc (Zn), titanium (Ti), copper (Cu), cerium (Ce) and tantalum (Ta), and a metal compound such as an oxide, a nitride, a carbide, an oxynitride or an oxycarbide of the metal.

More specific examples of the metal compound may comprise metal oxides, metal nitrides, metal carbides, metal oxynitrides and metal oxyborides such as silicon oxide, aluminum oxide, titanium oxide, indium oxide, tin oxide, indium tin oxide (ITO), tantalum oxide, zirconium oxide, niobium oxide, aluminum silicate (SiAlOx), boron carbide, tungsten carbide, silicon carbide, oxygen-containing silicon carbide, aluminum nitride, silicon nitride, boron nitride, aluminum oxynitride, silicon oxynitride, boron oxynitride, zirconium oxyboride, titanium oxyboride and complexes thereof, diamond-like carbon (DLC) and combinations thereof.

In addition, the barrier film may comprise an organic layer comprising an organic polymer. In other words, the barrier film may be a laminate of an inorganic layer comprising the inorganic barrier material, and the organic layer.

Types of a base film used as the base layer are not particularly limited, and known base films may be used. For example, various plastic films may be used as the base film. As the plastic film, a polyester film, an acetate resin film, a polyethersulfone film, a polycarbonate film, a polyamide film, a polyimide film, a polyolefin film, an acrylic film, a polyvinyl chloride film, a polyvinylidene chloride film, a polystyrene film, a polyvinyl alcohol film, a polyarylate film, polyphenylene sulfide film or the like may be used. A thickness of the base film is not particularly limited as well, and may be properly adjusted considering applications of the laminate. The base film may commonly have a thickness of approximately 10 μm to 110 μm, 10 μm to 80 μm, 10 μm to 60 μm, or 10 μm to 30 μm.

In the adhesive sheet according to one embodiment of the present specification, initial adhesive strength between the second adhesive layer and a SUS304 substrate may be greater than or equal to 5 gf/in and less than or equal to 200 gf/in and preferably greater than or equal to 15 gf/in and less than or equal to 150 gf/in, and such low initial adhesive strength allows rework when In the adhesive sheet according to one embodiment of the present specification, adhesive strength after coating the second adhesive layer and 20 minutes pass under a condition of 50° C. and 5 atmospheres is greater than or equal to 400 gf/in and less than or equal to 1500 gf/in and preferably greater than or equal to 500 gf/in and less than or equal to 1000 gf/in.

As the heat treatment of 50° C. and 5 atmospheres on the second adhesive layer, an autoclave may be used. By conducting an autoclave applying heat and pressure at the same time as above, compression efficiency may increase.

According to one embodiment of the present specification, the initial adhesive strength may be measured at a rate of 300 mm/min and an angle of 180 degrees using a texture analyzer (TA) 20 minutes after removing a release film attached to the second adhesive layer and laminating the result on a SUS304 substrate to a length of 1 inch using a 2 kg load roll.

According to one embodiment of the present specification, as for the adhesive strength after the autoclave, peel strength may be measured at a rate of 300 mm/min and an angle of 180 degrees using a texture analyzer (TA) after laminating on a SUS304 substrate to a length of 1 inch using a 2 kg load roll and going through the autoclave.

The adhesive sheet according to one embodiment of the present specification may have moisture permeability of 10 g/m²·24 h or less. In the above-mentioned range, the adhesive sheet may accomplish a structure capable of stably protecting a device by effectively blocking moisture or oxygen penetrating from the outside. Excellent moisture barrier properties are obtained as the moisture permeability is lower, and therefore, the lower limit is not particularly limited, however, the lower limit may be, for example, 0 g/m²·24 h.

In the present specification, the moisture permeability may be determined by, while attaching a nylon mesh to the film-shaped adhesive layer and placing the result under 100°

F. and 100% relative humidity, measuring moisture permeability in a thickness direction of the film-shaped layer, and the moisture permeability may be measured in accordance with the regulation in the ASTM F1249.

According to one embodiment of the present specification, the first adhesive layer may comprise a copolymer of diene and an olefin-based compound comprising one carbon-carbon double bond.

In the adhesive sheet provided in one embodiment of the present application, the first adhesive layer comprises a first adhesive composition comprising a copolymer of diene and an olefin-based compound comprising one carbon-carbon double bond.

The olefin-based compound may be a monomer comprising one carbon-carbon double bond, such as isobutylene, 1-butene, or 2-butene. The diene may be a monomer comprising two carbon-carbon double bonds, such as isoprene or butadiene. In other words, a homopolymer of an isobutylene monomer; a copolymer copolymerizing other monomers polymerizable with an isobutylene monomer; or a mixture thereof may be used. In one example, the copolymer of an olefin-based compound comprising one carbon-carbon double bond and a diene may be butyl rubber.

By using such a specific resin, moisture barrier properties to obtain in the present disclosure may be satisfied. In addition, the present disclosure may improve moisture resistance and heat resistance compared to existing isobutylene polymers having low moisture permeability and having low heat resistance as well.

According to another embodiment of the present specification, the first adhesive layer may further comprise a tackifier and a curable resin.

In one embodiment of the present application, the first adhesive composition may further comprise a tackifier and a curable resin.

The tackifier may preferably be a hydrogenated cyclic olefin-based polymer. Examples of the tackifier may comprise a hydrogenated petroleum resin obtained by hydrogenating a petroleum resin. The hydrogenated petroleum resin may be partially or completely hydrogenated, or may be a mixture of such resins. As such a tackifier, those having excellent moisture barrier properties while having favorable compatibility with the first adhesive composition, and having a low organic volatile component may be selected. Specific examples of the hydrogenated petroleum resin may comprise a hydrogenated terpene-based resin, a hydrogenated ester-based resin, a hydrogenated dicyclopentadiene-based resin or the like. The tackifier may have a weight average molecular weight (g/mol) of approximately 200 to 5,000. A content of the tackifier may be properly adjusted as necessary.

For example, the tackifier may be included in a ratio of, with respect to 100 parts by weight of a solid content of the first adhesive composition, 5 parts by weight to 100 parts by weight, 8 parts by weight to 95 parts by weight, 10 parts by weight to 93 parts by weight, or 15 parts by weight to 90 parts by weight.

The curable resin may exhibit, for example, adhesion properties by being cured, and may comprise curable resins comprising one or more thermally curable functional groups such as a glycidyl group, an isocyanate group, a hydroxyl group, a carboxyl group or an amide group, or comprising one or more functional groups curable by irradiation of electromagnetic waves such as an epoxide group, a cyclic ether group, a sulfide group, an acetal group or a lactone group. In addition, specific types of such a resin may comprise acrylic resins, polyester resins, isocyanate resins, epoxy resins or the like, but are not limited thereto.

In the present disclosure, aromatic or aliphatic; or linear or branched epoxy resins may be used as the curable resin. As those containing two or more functional groups, epoxy resins having an epoxy equivalent weight of 180 g/eq to 1,000 g/eq may be used in one embodiment of the present disclosure. By using an epoxy resin having an epoxy equivalent weight in the above-mentioned range, properties of adhesive performance, a glass transition temperature and the like of a cured material may be effectively maintained. Examples of such an epoxy resin may comprise one type, or a mixture of two or more types of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin or a dicyclopentadiene-modified phenol-type epoxy resin.

According to one embodiment of the present specification, the second adhesive layer may comprise a second adhesive composition comprising one or more types selected from the group consisting of olefin-based, urethane-based, acryl-based and silicone-based adhesive polymers.

In the present specification, the acryl-based polymer may mean a polymer comprising an acrylic monomer as a polymerization unit. The term polymerization unit in the present specification may mean a form of a certain monomer going through a polymerization reaction to form a part of an adhesive polymer.

Herein, the acrylic monomer means acrylic acid, methacrylic acid or a derivative thereof. The acrylic polymer may be included as a main component in the adhesive layer.

The term main component in the present specification means comprising the component in 55% or greater, 60% or greater, 65% or greater, 70% or greater, 75% or greater, 80% or greater, 85% or greater, 90% or greater or 95% or greater based on a weight. Herein, an upper limit of the weight ratio of the main component is not particularly limited, and for example, may be less than 100%.

According to one embodiment of the present specification, the polymer included in the second adhesive composition may comprise a polymerization unit of an alkyl (meth)acrylate, a hard comonomer and a crosslinkable monomer.

Herein, the alkyl (meth)acrylate is a main component of the polymer, and accordingly, the weight ratio of the polymerization unit in the polymer may be 55% or greater, 60% or greater, 65% or greater, 70% or greater, 75% or greater, 80% or greater, 85% or greater, 90% or greater or 95% or greater.

As the alkyl (meth)acrylate, those having a homopolymer glass transition temperature in a range of −80° C. to −30° C. may be used. The term homopolymer glass transition temperature in the present specification may mean a glass transition temperature of a homopolymer prepared using the corresponding monomer. As the alkyl (meth)acrylate, any type may be used as long as the homopolymer glass transition temperature is in the above-mentioned range. For example, alkyl (meth)acrylates having an alkyl group with 1 to 20 carbon atoms, 1 to 16 carbon atoms, 1 to 12 carbon atoms, 1 to 8 carbon atoms or 1 to 4 carbon atoms may be used. Herein, the alkyl group may be linear, branched or cyclic. Examples of such a monomer may comprise n-propyl (meth)acrylate, pentyl (meth)acrylate, 2-ethylhexyl (meth) acrylate, 2-ethylbutyl (meth)acrylate, n-octyl (meth)acrylate, isooctyl (meth)acrylate, isononyl (meth)acrylate, lauryl (meth)acrylate or the like may be included, and one or more thereof may be selected and used.

In the present specification, the term (meth)acrylic means acrylic or methacrylic.

In the present specification, the term hard comonomer is a monomer copolymerizable with the alkyl (meth)acrylate, and means a monomer that a homopolymer glass transition temperature of the monomer is in a range of 85° C. to 130° C. In another embodiment, the homopolymer glass transition temperature of the hard comonomer may be 125° C. or lower, 120° C. or lower, 115° C. or lower or approximately 110° C. or lower. Examples of such a comonomer may comprise isobornyl (meth)acrylate, vinyl pyrrolidone, hydroxyalkyl acrylamide (herein, the number of carbon atoms of the alkyl is from 1 to 4), tertiary-butyl (meth) acrylate, dihydrodicyclopentadienyl acrylate (DCPA), N-vinylformamide (VFA), cyclohexyl (meth)acrylate (CHMA), acrylamide, benzyl (meth)acrylate, tert-butyl acrylate, isobutyl methacrylate, n-butyl methacrylate, sec-butyl methacrylate, cyclopropyl acrylate, cyclobutyl acrylate, N,N-dimethyl (meth)acrylamide, N,N-diphenyl methacrylamide, N-(n-dodecyl) methacrylamide, 1-hexadecyl methacrylate, 2-methoxyethyl methacrylate, methyl methacrylate, N-naphthyl acrylate, 2-phenoxyethyl methacrylate, phenyl (meth)acrylate, 2-phenylethyl (meth)acrylate, n-propyl methacrylate, styrene, methyl acrylate, methacrylic acid dicyclopentanyl ester, N-vinyl caprolactam, N-hydroxyethyl acrylamide or the like, but are not limited thereto.

The hard comonomer may be included in the polymer in 5 parts by weight to 50 parts by weight with respect to 100 parts by weight of the alkyl (meth)acrylate. In another embodiment, the ratio may be 7 parts by weight or greater, 9 parts by weight or greater or 10 parts by weight or greater. In another embodiment, the ratio may be 45 parts by weight or less, 40 parts by weight or less or 38 parts by weight or less. Under such a ratio, the adhesive layer may exhibit proper peel strength properties.

According to one embodiment of the present specification, the crosslinkable monomer may be a monomer having a crosslinkable functional group, and may be selected without particular limit as long as it is capable of providing a crosslinkable functional group to the polymer produced through polymerization with the alkyl (meth)acrylate a monomer.

According to one embodiment of the present specification, the first and the second adhesive compositions may comprise a monomer having a crosslinkable functional group.

According to one embodiment of the present specification, the crosslinkable functional group may be any one or more selected from the group consisting of a hydroxyl group, an isocyanate group, a glycidyl group, an epoxy group, an amine group and a carboxyl group.

Examples of the monomer having a hydroxyl group may comprise hydroxyalkyl (meth)acrylate such as 2-hydroxyethyl (meth)acrylate, 2-hydroxypropyl (meth)acrylate, 4-hydroxybutyl (meth)acrylate, 6-hydroxyhexyl (meth)acrylate or 8-hydroxyoctyl (meth)acrylate; hydroxypolyalkylene glycol (meth)acrylate such as hydroxypolyethylene glycol (meth)acrylate or hydroxypolypropylene glycol (meth)acrylate, or the like, but are not limited thereto.

Examples of the monomer having a carboxyl group may comprise beta-carboxyethyl acrylate, (meth)acrylic acid, 2-(meth)acryloyloxy acetic acid, 3-(meth)acryloyloxy propanoic acid, 4-(meth)acryloyloxy butyric acid, an acrylic acid dimer, itaconic acid, maleic acid, maleic anhydride or the like, but are not limited thereto.

Examples of the monomer having an amine group may comprise 2-aminoethyl (meth)acrylate, 3-aminopropyl (meth)acrylate, N,N-dimethylaminoethyl (meth)acrylate, N,N-dimethylaminopropyl (meth)acrylate or the like, but are not limited thereto.

Among the monomers having various crosslinkable functional groups, proper types may be selected considering a target glass transition temperature of the acrylic polymer or reactivity with a crosslinking agent to describe later.

According to one embodiment of the present specification, the crosslinkable functional group may be selected without limit as long as, for example, it may produce a crosslinking reaction with a crosslinking agent to describe later in a temperature range of approximately 50° C. to 300° C.

According to one embodiment of the present specification, the alkyl (meth)acrylate may be included in 55 parts by weight to 95 parts by weight, the hard comonomer in 1 parts by weight to 30 parts by weight and the crosslinkable monomer in 1 parts by weight to 40 parts by weight based on 100 parts by weight of the polymer.

In the present specification, the term [parts by weight] means a weight ratio between each component unless defined otherwise.

According to one embodiment of the present specification, the first and the second adhesive compositions comprise a crosslinking agent.

According to another embodiment of the present specification, by comprising a crosslinking agent having a functional group capable of reacting with the crosslinkable functional group included in the polymer, the first and the second adhesive compositions having proper properties to be used in displays may be provided.

Specifically, the crosslinking agent may comprise any one or more functional groups selected from the group consisting of an alkoxysilane group, a carboxyl group, an acid anhydride group, a vinyl ether group, an amine group, a carbonyl group, an isocyanate group, an epoxy group, an aziridinyl group, a carbodiimide group and an oxazoline group. Types of the functional group may vary depending on the types of the crosslinkable functional group included in the polymer or others, or a mechanism of obtaining a crosslinking structure.

Examples of the crosslinking agent comprising a carboxyl group may comprise aromatic dicarboxylic acids such as o-phthalic acid, isophthalic acid, terephthalic acid, 1,4-dimethylterephthalic acid, 1,3-dimethylisophthalic acid, 5-sulfo-1,3-dimethylisophthalic acid, 4,4-biphenyldicarboxylic acid, 1,4-naphthalenedicarboxylic acid, 2,6-naphthalenedicarboxylic acid, norbornenedicarboxylic acid, diphenylmethane-4,4'-dicarboxylic acid or phenylindanedicarboxylic acid; aromatic dicarboxylic anhydrides such as phthalic anhydride, 1,8-naphthalenedicarboxylic anhydride or 2,3-naphthalenedicarboxylic anhydride; alicyclic dicarboxylic acids such as hexahydrophthalic acid; alicyclic dicarboxylic anhydrides such as hexahydrophthalic anhydride, 3-methyl-hexahydrophthalic anhydride, 4-methyl-hexahydrophthalic anhydride or 1,2-cyclohexanedicarboxylic anhydride; or aliphatic dicarboxylic acids such as oxalic acid, malonic acid, succinic acid, adipic acid, sebacic acid, azelaic acid, suberic acid, maleic acid, chloromaleic acid, fumaric acid, dodecanedioic acid, pimelic acid, citraconic acid, glutaric acid or itaconic acid.

Examples of the crosslinking agent comprising an acid anhydride group may comprise pyromellitic anhydride, benzophenonetetracarboxylic dianhydride, biphenyltetracarboxylic dianhydride, oxydiphthalic dianhydride, diphenylsulfonetetracarboxylic dianhydride, diphenylsulfidetetracarboxylic dianhydride, butanetetracarboxylic dianhydride, perylenetetracarboxylic dianhydride, naphthalenetetracarboxylic dianhydride or the like.

Examples of the crosslinking agent comprising a vinyl ether group may comprise ethylene glycol divinyl ether, diethylene glycol divinyl ether, triethylene glycol divinyl ether, tetraethylene glycol divinyl ether, pentaerythritol divinyl ether, propylene glycol divinyl ether, dipropylene glycol divinyl ether, tripropylene glycol divinyl ether, neopentyl glycol divinyl ether, 1,4-butanediol divinyl ether, 1,6-hexanediol divinyl ether, glycerin divinyl ether, trimethylolpropane divinyl ether, 1,4-dihydroxycyclohexane divinyl ether, 1,4-dihydroxymethylcyclohexane divinyl ether, hydroquinone divinyl ether, ethylene oxide-modified hydroquinone divinyl ether, ethylene oxide-modified resorcine divinyl ether, ethylene oxide-modified bisphenol A divinyl ether, ethylene oxide-modified bisphenol S divinyl ether, glycerin trivinyl ether, sorbitol tetravinyl ether, trimethylolpropane trivinyl ether, pentaerythritol trivinyl ether, pentaerythritol tetravinyl ether, dipentaerythritol hexavinyl ether, dipentaerythritol polyvinyl ether, ditrimethylolpropane tetravinyl ether, ditrimethylolpropane polyvinyl ether or the like.

Examples of the crosslinking agent comprising an amine group may comprise aliphatic diamines such as ethylenediamine or hexamethylenediamine; alicyclic diamines such as 4,4'-diamino-3,3'-dimethyldicyclohexylmethane, 4,4'-diamino-3,3'-dimethyldicyclohexyl, diaminocyclohexane or isophoronediamine; aromatic diamines such as xylenediamine, or the like.

Examples of the crosslinking agent comprising an isocyanate group may comprise aromatic polyisocyanates such as 1,3-phenylene diisocyanate, 4,4'-diphenyl diisocyanate, 1,4-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, 4,4',4"-triphenylmethane triisocyanate, ω,ω'-diisocyanate-1,3-dimethylbenzene, ω,ω'-diisocyanate-1,4-dimethylbenzene, ω,ω'-diisocyanate-1,4-diethylbenzene, 1,4-tetramethylxylylene diisocyanate, 1,3-tetramethylxylene diisocyanate, xylylene diisocyanate; aliphatic polyisocyanates such as trimethylene diisocyanate, tetramethylene diisocyanate, hexamethylene diisocyanate, pentamethylene diisocyanate, 1,2-propylene diisocyanate, 2,3-butylene diisocyanate, 1,3-butalene diisocyanate, dodecamethylene diisocyanate or 2,4,4-trimethylhexamethylene diisocyanate; alicyclic polyisocyanates such as 3-isocyanate methyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylenebis (cyclohexyl isocyanate) or 1,4-bis(isocyanatemethyl)cyclohexane, or the like, or a reaction material of one or more of the polyisocyanates and polyol.

Examples of the crosslinking agent comprising an epoxy group may comprise ethylene glycol diglycidyl ether, triglycidyl ether, trimethylolpropane triglycidyl ether, N,N,N', N'-tetraglycidyl-1,3-xylenediamine, glycerin diglycidyl ether or the like.

According to one embodiment of the present specification, the first and the second adhesive compositions may perform a crosslinking reaction with the crosslinkable functional group included in the polymer by comprising the crosslinking agent.

According to one embodiment of the present specification, the crosslinking agent may be included in a range of 0.001 parts by weight to 5 parts by weight in the composition with respect to 100 parts by weight of the polymer.

When the crosslinking agent content is greater than 5 parts by weight or less than 0.001 parts by weight, target storage modulus may not be accomplished at a temperature of −20° C.

According to one embodiment of the present specification, the adhesive composition may further comprise, in addition to the polymer and the crosslinking agent described above, known additional components such as an antistatic agent, a tackifier resin, a curing agent, a UV stabilizer, an antioxidant, a colorant, a reinforcing agent, a filler, a defoaming agent, a surfactant, a plasticizer or the like.

According to one embodiment of the present specification, the second adhesive composition may comprise a hydrophobic monomer selected from among silicone-based, fluorine-based and hydrocarbon, or a polymer comprising the same.

According to one embodiment of the present specification, the hydrophobic monomer or the polymer comprising the same may be a silicone-based monomer or a polymer comprising the According to one embodiment of the present specification, as the hydrophobic monomer or the polymer comprising the same, one or more selected from among butyl methacrylate (BMA), stearyl methacrylate (STMA) and FM-0721 (Chisso Corporation) may be used specifically.

According to one embodiment of the present specification, the hydrophobic monomer or the polymer comprising the same may be used together with a solvent.

According to one embodiment of the present specification, the solvent is toluene.

According to one embodiment of the present specification, the polymer may have a weight average molecular weight in a range of 10,000 to 200,000, and more preferably in a range of 30,000 to 100,000.

In the present specification, the term weight average molecular weight may mean a converted value for standard polystyrene measured by gel permeation chromatography (GPC), and unless particularly defined otherwise, a molecular weight of a certain polymer may mean a weight average molecular weight of the polymer.

According to one embodiment of the present specification, the hydrophobic monomer or the polymer comprising the same may be included in 0.01 parts by weight to 10 parts by weight and preferably included in 0.1 parts by weight to 7 parts by weight based on 100 parts by weight of the second adhesive composition. When the additive is included as in the above-mentioned range, the monomer or the polymer comprising the same is present on the adhesive surface at room temperature lowering initial room temperature peel strength, and by the main resin of the adhesive having a bigger role after the heating/pressurizing process and thereby strengthening adhesive strength with an adherend base, temperature-variable properties may be provided to the adhesive layer.

FIG. 1 illustrates a structure of the adhesive sheet. According to FIG. 1, a first adhesive layer (300) and a second adhesive layer (200) are formed on a barrier film including a base layer (600), a planarization layer (500) and a barrier layer (400), and a release film (100) is formed on the second adhesive layer (200).

One embodiment of the present specification may provide an organic electronic device encapsulation product including the adhesive sheet described above.

The organic electronic device encapsulation product may comprise a substrate; an organic electronic device formed on the substrate; and an adhesive sheet encapsulating the whole surface, for example, an upper surface and a side surface, of the organic electronic device.

The organic electronic device may be, for example, an organic light emitting device.

The organic electronic device encapsulation product may be an OLED panel.

In order to manufacture the organic electronic device, a step of, for example, using the above-described adhesive sheet on the organic electronic device-formed substrate so as to cover the organic electronic device may be included.

One embodiment of the present specification may provide a method for manufacturing an adhesive sheet comprising preparing a barrier film; and forming the adhesive sheet described above on the barrier film.

Mode for Disclosure

Hereinafter, the present specification will be described in detail with reference to examples. However, the examples according to the present specification may be modified to various other forms, and the scope of the present specification is not to be construed as being limited to the examples described below. Examples of the present specification are provided in order to more fully describe the present specification to those having average knowledge in the art.

Preparation Example

To an adhesive composition including ethylhexyl acrylate (EHA) in 65 parts by weight, methyl methacrylate (MMA) in 15 parts by weight, vinyl pyrrolidone (VP) in 5 parts by weight and hydroethyl acrylate (HEA) in 15 parts by weight based on 100 parts by weight of the adhesive composition, 1.2 parts by weight of a crosslinking agent (DR-7030HD, Sam Young Ink & Paint Mfg. Co., Ltd.) based on 100 parts by weight of the adhesive composition was introduced to prepare an adhesive composition.

Example 1

To the adhesive composition prepared as above, a polymer polymerizing butyl methacrylate (BMA) and FM-0721 (Chisso Corporation) in a ratio of 8:2 was added to prepare Adhesive Composition A. The polymer was added in 3 parts by weight based on 100 parts by weight of the adhesive composition.

Adhesive composition A was coated to 15 μm on a silicone pating-treated polyethylene terephthalate (PET) film, and then the result was dried for 3 minutes at 120° C. to form a second adhesive layer.

After that, the second adhesive layer was laminated with a first adhesive layer comprising a pressure-sensitive adhesive composition (LBFL-LX™, a commercial product of LG Chem) formed on a barrier film to form an adhesive sheet.

Example 2

An adhesive sheet was formed in the same manner as in Example 1 except that the polymer was added in 5 parts by weight based on 100 parts by weight of the adhesive composition to prepare Adhesive Composition B.

Example 3

An adhesive sheet was formed in the same manner as in Example 1 except that, as the polymer, a polymer polymerizing stearyl methacrylate (STMA) and FM-0721 (Chisso Corporation) in a ratio of 8:2 was added to prepare Adhesive Composition C.

Example 4

An adhesive sheet was formed in the same manner as in Example 3 except that the polymer was added in 5 parts by weight based on 100 parts by weight of the adhesive composition to prepare Adhesive Composition D.

Comparative Example 1

An adhesive sheet was formed only with the first adhesive layer of Example 1.

Comparative Example 2

An adhesive sheet was formed only with the second adhesive layer of Example 1.

Comparative Example 3

An adhesive sheet was formed in the same manner as in Example 1 except that a polymer was not added.

Initial adhesive strength, adhesive strength after heat treatment, moisture permeability, reliability and reworkability of the adhesive sheets according to the examples and the comparative examples were measured, and described in the following [Table 1].

Initial adhesive strength was measured after laminating each of the adhesive sheets according to the examples and the comparative examples on a SUS304 substrate and then leaving the result unattended for 20 minutes. In addition, as the adhesive strength after heat treatment, adhesive strength was measured after performing autoclave treatment for 20 minutes under 50° C. and 5 atmospheres.

When evaluating reworkability, it was expressed as OK when the adhesive fell off without remaining on the substrate when re-peeled after 5 minutes had passed after attaching the adhesive sheet, and NG when adhesive residues remained.

In addition, in the reliability evaluation, it was expressed as OK when lifting or bubbles were not generated at an interface between the substrate and the adhesive layer after performing the autoclave treatment and then maintaining for 500 hours in a constant temperature and humidity chamber of 85° C. and 85% relative humidity, and NG when these were generated.

Moisture permeability was determined by, while attaching a nylon mesh to the adhesive sheet and placing the result under 100° F. and 100% relative humidity, measuring moisture permeability in a thickness direction of the adhesive sheet in accordance with the regulation in the ASTM F1249.

TABLE 1

| | Example 1 | Example 2 | Example 3 | Example 4 | Compartive Example 1 | Comparative Example 2 | Comparative Example 3 |
|---|---|---|---|---|---|---|---|
| Initial Adhesive Strength (gf/in) | 21 | 16 | 27 | 22 | 175 | 24 | 690 |
| Adhesive Strength after Heat Treatment (gf/in) | 720 | 790 | 840 | 950 | 284 | 730 | 810 |
| Moisture Permeability (g/m² · 24 h) | 8 | 9 | 7 | 8 | 5 | 337 | 8 |
| Reliability | OK | OK | OK | OK | OK | NG | OK |
| Reworkability | OK | OK | OK | OK | NG | OK | NG |

According to Examples 1 to 4 of Table 1, it was seen that reworkability was excellent by having low initial adhesive strength, and adhesive strength was high after heat treatment, and reliability was satisfied by having low moisture permeability.

According to Comparative Example 1 of Table 1, it was seen that rework properties were not provided by having high initial adhesive strength before heat treatment.

According to Comparative Example 2 of Table 1, reliability was not satisfied due to insufficient moisture barrier properties, and a lifting phenomenon was observed.

According to Comparative Example 3 of Table 1, it was seen that rework properties were not obtained by having high initial adhesive strength.

CROSS-REFERENCE TO RELATED APPLICATIONS

This application claims priority to and the benefits of Korean Patent Application No. 10-2018-0003961, filed with the Korean Intellectual Property Office on Jan. 11, 2018, the entire contents of which are incorporated herein by reference.

TECHNICAL FIELD

The present specification relates to a temperature-variable adhesive sheet, and a method for manufacturing a temperature-variable adhesive sheet using the same.

BACKGROUND OF THE INVENTION

An organic electronic device (OED) means a device comprising an organic material layer in which an exchange of charges occurs using holes and electrons, and examples thereof may comprise a photovoltaic device, a rectifier, a transmitter, an organic light emitting diode (OLED) and the like.

Among the organic electronic devices, an organic light emitting diode (OLED) has lower power consumption, faster response time, and is advantageous for thinning of display device and illumination compared to existing light sources. In addition, an OLED has excellent space utilization, and is expected to be used in various fields covering various portable devices, monitors, notebooks and TVs.

In commercializing and expanding applications of an OLED, the main problem is durability. Organic materials and metal electrodes included in an OLED are very readily oxidized by external factors such as moisture. Accordingly, products comprising an OLED are highly sensitive to environmental factors. Accordingly, various methods have been proposed in order to effectively block penetration of oxygen, moisture or the like from the outside into an organic electronic device such as an OLED.

Patent Document 1 (Korean Patent Application Laid-Open Publication No. 2008-0088606) relates to an adhesive encapsulating composition film and an organic electroluminescent device, and the adhesive is based on polyisobutylene (PIB), and has poor processability and poor reliability under a high temperature and high humidity condition.

Accordingly, development of encapsulant capable of maintaining reliability under a high temperature and high humidity condition and having excellent optical properties and reworkability while securing a required lifetime and effectively blocking penetration of moisture in an organic electronic device has been required.

BRIEF SUMMARY OF THE INVENTION

The present specification is directed to providing a temperature-variable adhesive sheet, and a method for manufacturing a temperature-variable adhesive sheet using the same.

One embodiment of the present specification provides an adhesive sheet in which a first adhesive layer and a second adhesive layer are consecutively provided on a barrier film, wherein initial adhesive strength of the second adhesive layer with a SUS304 substrate after coating and then drying for 20 minutes is 200 gf/in or less, and adhesive strength after 20 minutes pass under a condition of 50° C. and 5 atmospheres is 400 gf/in or greater.

Another embodiment of the present specification provides an organic electronic device encapsulation product comprising the adhesive sheet described above.

Still another embodiment of the present specification provides a method for manufacturing an adhesive sheet comprising preparing a barrier film; and forming the adhesive sheet descried above on the barrier film.

Advantageous Effects

An adhesive sheet according to one embodiment of the present specification has an advantage of, while maintaining properties of existing adhesive sheets such as adhesion properties, allowing rework when incorrectly attached due to low initial adhesive strength.

BRIEF DESCRIPTION OF THE DRAWING

FIG. 1 illustrates an adhesive sheet according to one embodiment of the present specification.

DETAILED DESCRIPTION OF THE INVENTION

In the present specification, a description of a certain member being placed "on" another member comprises not only a case of the one member adjoining the another member but a case of still another member being present between the two members.

In the present specification, a description of a certain part "including" certain constituents means capable of further comprising other constituents, and does not exclude other constituents unless particularly stated on the contrary.

Hereinafter, the present specification will be described in more detail.

One embodiment of the present specification provides an adhesive sheet in which a first adhesive layer and a second adhesive layer are consecutively provided on a barrier film, wherein initial adhesive strength of the second adhesive layer with a SUS304 substrate is 200 gf/in or less, and adhesive strength after 20 minutes pass under a condition of 50° C. and 5 atmospheres is 400 gf/in or greater.

According to one embodiment of the present specification, the barrier film may have a structure in which a base layer, a planarization layer and a barrier layer are laminated.

According to one embodiment of the present specification, the first adhesive layer may be provided on the barrier layer of the barrier film.

In one embodiment of the present application, the barrier film may comprise various inorganic barrier materials, and examples of the inorganic barrier material may comprise at least one type of metal selected from the group consisting of silicon (Si), aluminum (Al), indium (In), tin (Sn), zinc (Zn), titanium (Ti), copper (Cu), cerium (Ce) and tantalum (Ta), and a metal compound such as an oxide, a nitride, a carbide, an oxynitride or an oxycarbide of the metal.

More specific examples of the metal compound may comprise metal oxides, metal nitrides, metal carbides, metal oxynitrides and metal oxyborides such as silicon oxide, aluminum oxide, titanium oxide, indium oxide, tin oxide, indium tin oxide (ITO), tantalum oxide, zirconium oxide, niobium oxide, aluminum silicate (SiAlOx), boron carbide, tungsten carbide, silicon carbide, oxygen-containing silicon carbide, aluminum nitride, silicon nitride, boron nitride, aluminum oxynitride, silicon oxynitride, boron oxynitride, zirconium oxyboride, titanium oxyboride and complexes thereof, diamond-like carbon (DLC) and combinations thereof.

In addition, the barrier film may comprise an organic layer comprising an organic polymer. In other words, the barrier film may be a laminate of an inorganic layer comprising the inorganic barrier material, and the organic layer.

Types of a base film used as the base layer are not particularly limited, and known base films may be used. For example, various plastic films may be used as the base film. As the plastic film, a polyester film, an acetate resin film, a polyethersulfone film, a polycarbonate film, a polyamide film, a polyimide film, a polyolefin film, an acrylic film, a polyvinyl chloride film, a polyvinylidene chloride film, a polystyrene film, a polyvinyl alcohol film, a polyarylate film, polyphenylene sulfide film or the like may be used. A thickness of the base film is not particularly limited as well, and may be properly adjusted considering applications of the laminate. The base film may commonly have a thickness of approximately 10 μm to 110 μm, 10 μm to 80 μm, 10 μm to 60 μm, or 10 μm to 30 μm.

In the adhesive sheet according to one embodiment of the present specification, initial adhesive strength between the second adhesive layer and a SUS304 substrate may be greater than or equal to 5 gf/in and less than or equal to 200 gf/in and preferably greater than or equal to 15 gf/in and less than or equal to 150 gf/in, and such low initial adhesive strength allows rework when In the adhesive sheet according to one embodiment of the present specification, adhesive strength after coating the second adhesive layer and 20 minutes pass under a condition of 50° C. and 5 atmospheres is greater than or equal to 400 gf/in and less than or equal to 1500 gf/in and preferably greater than or equal to 500 gf/in and less than or equal to 1000 gf/in.

As the heat treatment of 50° C. and 5 atmospheres on the second adhesive layer, an autoclave may be used. By conducting an autoclave applying heat and pressure at the same time as above, compression efficiency may increase.

According to one embodiment of the present specification, the initial adhesive strength may be measured at a rate of 300 mm/min and an angle of 180 degrees using a texture analyzer (TA) 20 minutes after removing a release film attached to the second adhesive layer and laminating the result on a SUS304 substrate to a length of 1 inch using a 2 kg load roll.

According to one embodiment of the present specification, as for the adhesive strength after the autoclave, peel strength may be measured at a rate of 300 mm/min and an angle of 180 degrees using a texture analyzer (TA) after laminating on a SUS304 substrate to a length of 1 inch using a 2 kg load roll and going through the autoclave.

The adhesive sheet according to one embodiment of the present specification may have moisture permeability of 10 g/m$^2$·24 h or less. In the above-mentioned range, the adhesive sheet may accomplish a structure capable of stably protecting a device by effectively blocking moisture or oxygen penetrating from the outside. Excellent moisture barrier properties are obtained as the moisture permeability is lower, and therefore, the lower limit is not particularly limited, however, the lower limit may be, for example, 0 g/m$^2$·24 h.

In the present specification, the moisture permeability may be determined by, while attaching a nylon mesh to the film-shaped adhesive layer and placing the result under 100° F. and 100% relative humidity, measuring moisture permeability in a thickness direction of the film-shaped layer, and the moisture permeability may be measured in accordance with the regulation in the ASTM F1249.

According to one embodiment of the present specification, the first adhesive layer may comprise a copolymer of diene and an olefin-based compound comprising one carbon-carbon double bond.

In the adhesive sheet provided in one embodiment of the present application, the first adhesive layer comprises a first adhesive composition comprising a copolymer of diene and an olefin-based compound comprising one carbon-carbon double bond.

The olefin-based compound may be a monomer comprising one carbon-carbon double bond, such as isobutylene, 1-butene, or 2-butene. The diene may be a monomer comprising two carbon-carbon double bonds, such as isoprene or butadiene. In other words, a homopolymer of an isobutylene monomer; a copolymer copolymerizing other monomers polymerizable with an isobutylene monomer; or a mixture thereof may be used. In one example, the copolymer of an olefin-based compound comprising one carbon-carbon double bond and a diene may be butyl rubber.

By using such a specific resin, moisture barrier properties to obtain in the present disclosure may be satisfied. In addition, the present disclosure may improve moisture resistance and heat resistance compared to existing isobutylene polymers having low moisture permeability and having low heat resistance as well.

According to another embodiment of the present specification, the first adhesive layer may further comprise a tackifier and a curable resin.

In one embodiment of the present application, the first adhesive composition may further comprise a tackifier and a curable resin.

The tackifier may preferably be a hydrogenated cyclic olefin-based polymer. Examples of the tackifier may comprise a hydrogenated petroleum resin obtained by hydrogenating a petroleum resin. The hydrogenated petroleum resin may be partially or completely hydrogenated, or may be a mixture of such resins. As such a tackifier, those having excellent moisture barrier properties while having favorable compatibility with the first adhesive composition, and having a low organic volatile component may be selected. Specific examples of the hydrogenated petroleum resin may comprise a hydrogenated terpene-based resin, a hydrogenated ester-based resin, a hydrogenated dicyclopentadiene-based resin or the like. The tackifier may have a weight average molecular weight (g/mol) of approximately 200 to 5,000. A content of the tackifier may be properly adjusted as necessary.

For example, the tackifier may be included in a ratio of, with respect to 100 parts by weight of a solid content of the first adhesive composition, 5 parts by weight to 100 parts by weight, 8 parts by weight to 95 parts by weight, 10 parts by weight to 93 parts by weight, or 15 parts by weight to 90 parts by weight.

The curable resin may exhibit, for example, adhesion properties by being cured, and may comprise curable resins comprising one or more thermally curable functional groups such as a glycidyl group, an isocyanate group, a hydroxyl group, a carboxyl group or an amide group, or comprising one or more functional groups curable by irradiation of electromagnetic waves such as an epoxide group, a cyclic ether group, a sulfide group, an acetal group or a lactone group. In addition, specific types of such a resin may comprise acrylic resins, polyester resins, isocyanate resins, epoxy resins or the like, but are not limited thereto.

In the present disclosure, aromatic or aliphatic; or linear or branched epoxy resins may be used as the curable resin. As those containing two or more functional groups, epoxy resins having an epoxy equivalent weight of 180 g/eq to 1,000 g/eq may be used in one embodiment of the present disclosure. By using an epoxy resin having an epoxy equivalent weight in the above-mentioned range, properties of adhesive performance, a glass transition temperature and the like of a cured material may be effectively maintained. Examples of such an epoxy resin may comprise one type, or a mixture of two or more types of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin or a dicyclopentadiene-modified phenol-type epoxy resin.

According to one embodiment of the present specification, the second adhesive layer may comprise a second adhesive composition comprising one or more types selected from the group consisting of olefin-based, urethane-based, acryl-based and silicone-based adhesive polymers.

In the present specification, the acryl-based polymer may mean a polymer comprising an acrylic monomer as a polymerization unit. The term polymerization unit in the present specification may mean a form of a certain monomer going through a polymerization reaction to form a part of an adhesive polymer.

Herein, the acrylic monomer means acrylic acid, methacrylic acid or a derivative thereof. The acrylic polymer may be included as a main component in the adhesive layer.

The term main component in the present specification means comprising the component in 55% or greater, 60% or greater, 65% or greater, 70% or greater, 75% or greater, 80% or greater, 85% or greater, 90% or greater or 95% or greater based on a weight. Herein, an upper limit of the weight ratio of the main component is not particularly limited, and for example, may be less than 100%.

According to one embodiment of the present specification, the polymer included in the second adhesive composition may comprise a polymerization unit of an alkyl (meth)acrylate, a hard comonomer and a crosslinkable monomer.

Herein, the alkyl (meth)acrylate is a main component of the polymer, and accordingly, the weight ratio of the polymerization unit in the polymer may be 55% or greater, 60% or greater, 65% or greater, 70% or greater, 75% or greater, 80% or greater, 85% or greater, 90% or greater or 95% or greater.

As the alkyl (meth)acrylate, those having a homopolymer glass transition temperature in a range of $-80°$ C. to $-30°$ C. may be used. The term homopolymer glass transition temperature in the present specification may mean a glass transition temperature of a homopolymer prepared using the corresponding monomer. As the alkyl (meth)acrylate, any type may be used as long as the homopolymer glass transition temperature is in the above-mentioned range. For example, alkyl (meth)acrylates having an alkyl group with 1 to 20 carbon atoms, 1 to 16 carbon atoms, 1 to 12 carbon atoms, 1 to 8 carbon atoms or 1 to 4 carbon atoms may be used. Herein, the alkyl group may be linear, branched or cyclic. Examples of such a monomer may comprise n-propyl (meth)acrylate, pentyl (meth)acrylate, 2-ethylhexyl (meth) acrylate, 2-ethylbutyl (meth)acrylate, n-octyl (meth)acrylate, isooctyl (meth)acrylate, isononyl (meth)acrylate, lauryl (meth)acrylate or the like may be included, and one or more thereof may be selected and used.

In the present specification, the term (meth)acrylic means acrylic or methacrylic.

In the present specification, the term hard comonomer is a monomer copolymerizable with the alkyl (meth)acrylate, and means a monomer that a homopolymer glass transition temperature of the monomer is in a range of $85°$ C. to $130°$ C. In another embodiment, the homopolymer glass transition temperature of the hard comonomer may be $125°$ C. or lower, $120°$ C. or lower, $115°$ C. or lower or approximately $110°$ C. or lower. Examples of such a comonomer may comprise isobornyl (meth)acrylate, vinyl pyrrolidone, hydroxyalkyl acrylamide (herein, the number of carbon atoms of the alkyl is from 1 to 4), tertiary-butyl (meth) acrylate, dihydrodicyclopentadienyl acrylate (DCPA), N-vinylformamide (VFA), cyclohexyl (meth)acrylate (CHMA), acrylamide, benzyl (meth)acrylate, tert-butyl acrylate, isobutyl methacrylate, n-butyl methacrylate, sec-butyl methacrylate, cyclopropyl acrylate, cyclobutyl acrylate, N,N-dimethyl (meth)acrylamide, N,N-diphenyl methacrylamide, N-(n-dodecyl) methacrylamide, 1-hexadecyl methacrylate, 2-methoxyethyl methacrylate, methyl methacrylate, N-naphthyl acrylate, 2-phenoxyethyl methacrylate, phenyl (meth)acrylate, 2-phenylethyl (meth)acrylate, n-propyl methacrylate, styrene, methyl acrylate, methacrylic acid dicyclopentanyl ester, N-vinyl caprolactam, N-hydroxyethyl acrylamide or the like, but are not limited thereto.

The hard comonomer may be included in the polymer in 5 parts by weight to 50 parts by weight with respect to 100 parts by weight of the alkyl (meth)acrylate. In another embodiment, the ratio may be 7 parts by weight or greater, 9 parts by weight or greater or 10 parts by weight or greater. In another embodiment, the ratio may be 45 parts by weight or less, 40 parts by weight or less or 38 parts by weight or less. Under such a ratio, the adhesive layer may exhibit proper peel strength properties.

According to one embodiment of the present specification, the crosslinkable monomer may be a monomer having a crosslinkable functional group, and may be selected without particular limit as long as it is capable of providing a crosslinkable functional group to the polymer produced through polymerization with the alkyl (meth)acrylate a monomer.

According to one embodiment of the present specification, the first and the second adhesive compositions may comprise a monomer having a crosslinkable functional group.

According to one embodiment of the present specification, the crosslinkable functional group may be any one or more selected from the group consisting of a hydroxyl group, an isocyanate group, a glycidyl group, an epoxy group, an amine group and a carboxyl group.

Examples of the monomer having a hydroxyl group may comprise hydroxyalkyl (meth)acrylate such as 2-hydroxyethyl (meth)acrylate, 2-hydroxypropyl (meth)acrylate, 4-hydroxybutyl (meth)acrylate, 6-hydroxyhexyl (meth)acrylate or 8-hydroxyoctyl (meth)acrylate; hydroxypolyalkylene glycol (meth)acrylate such as hydroxypolyethylene glycol (meth)acrylate or hydroxypolypropylene glycol (meth)acrylate, or the like, but are not limited thereto.

Examples of the monomer having a carboxyl group may comprise beta-carboxyethyl acrylate, (meth)acrylic acid, 2-(meth)acryloyloxy acetic acid, 3-(meth)acryloyloxy propanoic acid, 4-(meth)acryloyloxy butyric acid, an acrylic acid dimer, itaconic acid, maleic acid, maleic anhydride or the like, but are not limited thereto.

Examples of the monomer having an amine group may comprise 2-aminoethyl (meth)acrylate, 3-aminopropyl (meth)acrylate, N,N-dimethylaminoethyl (meth)acrylate, N,N-dimethylaminopropyl (meth)acrylate or the like, but are not limited thereto.

Among the monomers having various crosslinkable functional groups, proper types may be selected considering a target glass transition temperature of the acrylic polymer or reactivity with a crosslinking agent to describe later.

According to one embodiment of the present specification, the crosslinkable functional group may be selected without limit as long as, for example, it may produce a crosslinking reaction with a crosslinking agent to describe later in a temperature range of approximately $50°$ C. to $300°$ C.

According to one embodiment of the present specification, the alkyl (meth)acrylate may be included in 55 parts by weight to 95 parts by weight, the hard comonomer in 1 parts by weight to 30 parts by weight and the crosslinkable monomer in 1 parts by weight to 40 parts by weight based on 100 parts by weight of the polymer.

In the present specification, the term [parts by weight] means a weight ratio between each component unless defined otherwise.

According to one embodiment of the present specification, the first and the second adhesive compositions comprise a crosslinking agent.

According to another embodiment of the present specification, by comprising a crosslinking agent having a functional group capable of reacting with the crosslinkable functional group included in the polymer, the first and the second adhesive compositions having proper properties to be used in displays may be provided.

Specifically, the crosslinking agent may comprise any one or more functional groups selected from the group consisting of an alkoxysilane group, a carboxyl group, an acid anhydride group, a vinyl ether group, an amine group, a carbonyl group, an isocyanate group, an epoxy group, an aziridinyl group, a carbodiimide group and an oxazoline group. Types of the functional group may vary depending on the types of the crosslinkable functional group included in the polymer or others, or a mechanism of obtaining a crosslinking structure.

Examples of the crosslinking agent comprising a carboxyl group may comprise aromatic dicarboxylic acids such as o-phthalic acid, isophthalic acid, terephthalic acid, 1,4-dimethylterephthalic acid, 1,3-dimethylisophthalic acid, 5-sulfo-1,3-dimethylisophthalic acid, 4,4-biphenyldicarboxylic acid, 1,4-naphthalenedicarboxylic acid, 2,6-naphthalenedicarboxylic acid, norbornenedicarboxylic acid, diphenylmethane-4,4'-dicarboxylic acid or phenylindanedicarboxylic acid; aromatic dicarboxylic anhydrides such as phthalic anhydride, 1,8-naphthalenedicarboxylic anhydride or 2,3-naphthalenedicarboxylic anhydride; alicyclic dicarboxylic acids such as hexahydrophthalic acid; alicyclic dicarboxylic anhydrides such as hexahydrophthalic anhydride, 3-methyl-hexahydrophthalic anhydride, 4-methyl-hexahydrophthalic anhydride or 1,2-cyclohexanedicarboxylic anhydride; or aliphatic dicarboxylic acids such as oxalic acid, malonic acid, succinic acid, adipic acid, sebacic acid, azelaic acid, suberic acid, maleic acid, chloromaleic acid, fumaric acid, dodecanedioic acid, pimelic acid, citraconic acid, glutaric acid or itaconic acid.

Examples of the crosslinking agent comprising an acid anhydride group may comprise pyromellitic anhydride, benzophenonetetracarboxylic dianhydride, biphenyltetracarboxylic dianhydride, oxydiphthalic dianhydride, diphenylsulfonetetracarboxylic dianhydride, diphenylsulfidetetracarboxylic dianhydride, butanetetracarboxylic dianhydride, perylenetetracarboxylic dianhydride, naphthalenetetracarboxylic dianhydride or the like.

Examples of the crosslinking agent comprising a vinyl ether group may comprise ethylene glycol divinyl ether, diethylene glycol divinyl ether, triethylene glycol divinyl ether, tetraethylene glycol divinyl ether, pentaerythritol divinyl ether, propylene glycol divinyl ether, dipropylene glycol divinyl ether, tripropylene glycol divinyl ether, neopentyl glycol divinyl ether, 1,4-butanediol divinyl ether, 1,6-hexanediol divinyl ether, glycerin divinyl ether, trimethylolpropane divinyl ether, 1,4-dihydroxycyclohexane divinyl ether, 1,4-dihydroxymethylcyclohexane divinyl ether, hydroquinone divinyl ether, ethylene oxide-modified hydroquinone divinyl ether, ethylene oxide-modified resorcine divinyl ether, ethylene oxide-modified bisphenol A divinyl ether, ethylene oxide-modified bisphenol S divinyl ether, glycerin trivinyl ether, sorbitol tetravinyl ether, trimethylolpropane trivinyl ether, pentaerythritol trivinyl ether, pentaerythritol tetravinyl ether, dipentaerythritol hexavinyl ether, dipentaerythritol polyvinyl ether, ditrimethylolpropane tetravinyl ether, ditrimethylolpropane polyvinyl ether or the like.

Examples of the crosslinking agent comprising an amine group may comprise aliphatic diamines such as ethylenediamine or hexamethylenediamine; alicyclic diamines such as 4,4'-diamino-3,3'-dimethyldicyclohexylmethane, 4,4'-di-amino-3,3'-dimethyldicyclohexyl, diaminocyclohexane or isophoronediamine; aromatic diamines such as xylenediamine, or the like.

Examples of the crosslinking agent comprising an isocyanate group may comprise aromatic polyisocyanates such as 1,3-phenylene diisocyanate, 4,4'-diphenyl diisocyanate, 1,4-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, 4,4',4"-triphenylmethane triisocyanate, ω,ω'-diisocyanate-1,3-dimethylbenzene, ω,ω'-diisocyanate-1,4-dimethylbenzene, ω,ω'-diisocyanate-1,4-diethylbenzene, 1,4-tetramethylxylylene diisocyanate, 1,3-tetramethylxylene diisocyanate, xylylene diisocyanate; aliphatic polyisocyanates such as trimethylene diisocyanate, tetramethylene diisocyanate, hexamethylene diisocyanate, pentamethylene diisocyanate, 1,2-propylene diisocyanate, 2,3-butylene diisocyanate, 1,3-butalene diisocyanate, dodecamethylene diisocyanate or 2,4,4-trimethylhexamethylene diisocyanate; alicyclic polyisocyanates such as 3-isocyanate methyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylenebis(cyclohexyl isocyanate) or 1,4-bis(isocyanatemethyl)cyclohexane, or the like, or a reaction material of one or more of the polyisocyanates and polyol.

Examples of the crosslinking agent comprising an epoxy group may comprise ethylene glycol diglycidyl ether, triglycidyl ether, trimethylolpropane triglycidyl ether, N,N,N', N'-tetraglycidyl-1,3-xylenediamine, glycerin diglycidyl ether or the like.

According to one embodiment of the present specification, the first and the second adhesive compositions may perform a crosslinking reaction with the crosslinkable functional group included in the polymer by comprising the crosslinking agent.

According to one embodiment of the present specification, the crosslinking agent may be included in a range of 0.001 parts by weight to 5 parts by weight in the composition with respect to 100 parts by weight of the polymer.

When the crosslinking agent content is greater than 5 parts by weight or less than 0.001 parts by weight, target storage modulus may not be accomplished at a temperature of −20° C.

According to one embodiment of the present specification, the adhesive composition may further comprise, in addition to the polymer and the crosslinking agent described above, known additional components such as an antistatic agent, a tackifier resin, a curing agent, a UV stabilizer, an antioxidant, a colorant, a reinforcing agent, a filler, a defoaming agent, a surfactant, a plasticizer or the like.

According to one embodiment of the present specification, the second adhesive composition may comprise a hydrophobic monomer selected from among silicone-based, fluorine-based and hydrocarbon, or a polymer comprising the same.

According to one embodiment of the present specification, the hydrophobic monomer or the polymer comprising the same may be a silicone-based monomer or a polymer comprising the According to one embodiment of the present specification, as the hydrophobic monomer or the polymer comprising the same, one or more selected from among butyl methacrylate (BMA), stearyl methacrylate (STMA) and FM-0721 (Chisso Corporation) may be used specifically.

According to one embodiment of the present specification, the hydrophobic monomer or the polymer comprising the same may be used together with a solvent.

According to one embodiment of the present specification, the solvent is toluene.

According to one embodiment of the present specification, the polymer may have a weight average molecular weight in a range of 10,000 to 200,000, and more preferably in a range of 30,000 to 100,000.

In the present specification, the term weight average molecular weight may mean a converted value for standard polystyrene measured by gel permeation chromatography (GPC), and unless particularly defined otherwise, a molecular weight of a certain polymer may mean a weight average molecular weight of the polymer.

According to one embodiment of the present specification, the hydrophobic monomer or the polymer comprising the same may be included in 0.01 parts by weight to 10 parts by weight and preferably included in 0.1 parts by weight to 7 parts by weight based on 100 parts by weight of the second adhesive composition. When the additive is included as in the above-mentioned range, the monomer or the polymer comprising the same is present on the adhesive surface at room temperature lowering initial room temperature peel strength, and by the main resin of the adhesive having a bigger role after the heating/pressurizing process and thereby strengthening adhesive strength with an adherend base, temperature-variable properties may be provided to the adhesive layer.

FIG. 1 illustrates a structure of the adhesive sheet. According to FIG. 1, a first adhesive layer (300) and a second adhesive layer (200) are formed on a barrier film including a base layer (600), a planarization layer (500) and a barrier layer (400), and a release film (100) is formed on the second adhesive layer (200).

One embodiment of the present specification may provide an organic electronic device encapsulation product including the adhesive sheet described above.

The organic electronic device encapsulation product may comprise a substrate; an organic electronic device formed on the substrate; and an adhesive sheet encapsulating the whole surface, for example, an upper surface and a side surface, of the organic electronic device.

The organic electronic device may be, for example, an organic light emitting device.

The organic electronic device encapsulation product may be an OLED panel.

In order to manufacture the organic electronic device, a step of, for example, using the above-described adhesive sheet on the organic electronic device-formed substrate so as to cover the organic electronic device may be included.

One embodiment of the present specification may provide a method for manufacturing an adhesive sheet comprising preparing a barrier film; and forming the adhesive sheet described above on the barrier film.

Mode for Disclosure

Hereinafter, the present specification will be described in detail with reference to examples. However, the examples according to the present specification may be modified to various other forms, and the scope of the present specification is not to be construed as being limited to the examples described below. Examples of the present specification are provided in order to more fully describe the present specification to those having average knowledge in the art.

Preparation Example

To an adhesive composition including ethylhexyl acrylate (EHA) in 65 parts by weight, methyl methacrylate (MMA) in 15 parts by weight, vinyl pyrrolidone (VP) in 5 parts by weight and hydroethyl acrylate (HEA) in 15 parts by weight based on 100 parts by weight of the adhesive composition, 1.2 parts by weight of a crosslinking agent (DR-7030HD, Sam Young Ink & Paint Mfg. Co., Ltd.) based on 100 parts by weight of the adhesive composition was introduced to prepare an adhesive composition.

Example 1

To the adhesive composition prepared as above, a polymer polymerizing butyl methacrylate (BMA) and FM-0721 (Chisso Corporation) in a ratio of 8:2 was added to prepare Adhesive Composition A. The polymer was added in 3 parts by weight based on 100 parts by weight of the adhesive composition.

Adhesive composition A was coated to 15 μm on a silicone pating-treated polyethylene terephthalate (PET) film, and then the result was dried for 3 minutes at 120° C. to form a second adhesive layer.

After that, the second adhesive layer was laminated with a first adhesive layer comprising a pressure-sensitive adhesive composition (LBFL-LX™, a commercial product of LG Chem) formed on a barrier film to form an adhesive sheet.

Example 2

An adhesive sheet was formed in the same manner as in Example 1 except that the polymer was added in 5 parts by weight based on 100 parts by weight of the adhesive composition to prepare Adhesive Composition B.

Example 3

An adhesive sheet was formed in the same manner as in Example 1 except that, as the polymer, a polymer polymerizing stearyl methacrylate (STMA) and FM-0721 (Chisso Corporation) in a ratio of 8:2 was added to prepare Adhesive Composition C.

Example 4

An adhesive sheet was formed in the same manner as in Example 3 except that the polymer was added in 5 parts by weight based on 100 parts by weight of the adhesive composition to prepare Adhesive Composition D.

Comparative Example 1

An adhesive sheet was formed only with the first adhesive layer of Example 1.

Comparative Example 2

An adhesive sheet was formed only with the second adhesive layer of Example 1.

Comparative Example 3

An adhesive sheet was formed in the same manner as in Example 1 except that a polymer was not added.

Initial adhesive strength, adhesive strength after heat treatment, moisture permeability, reliability and reworkability of the adhesive sheets according to the examples and the comparative examples were measured, and described in the following [Table 1].

Initial adhesive strength was measured after laminating each of the adhesive sheets according to the examples and the comparative examples on a SUS304 substrate and then leaving the result unattended for 20 minutes. In addition, as the adhesive strength after heat treatment, adhesive strength was measured after performing autoclave treatment for 20 minutes under 50° C. and 5 atmospheres.

When evaluating reworkability, it was expressed as OK when the adhesive fell off without remaining on the substrate when re-peeled after 5 minutes had passed after attaching the adhesive sheet, and NG when adhesive residues remained.

In addition, in the reliability evaluation, it was expressed as OK when lifting or bubbles were not generated at an interface between the substrate and the adhesive layer after performing the autoclave treatment and then maintaining for 500 hours in a constant temperature and humidity chamber of 85° C. and 85% relative humidity, and NG when these were generated.

Moisture permeability was determined by, while attaching a nylon mesh to the adhesive sheet and placing the result under 100° F. and 100% relative humidity, measuring moisture permeability in a thickness direction of the adhesive sheet in accordance with the regulation in the ASTM F1249.

adhesive layer and a SUS304 substrate, after 20 minutes passed under a condition of 50° C. and 5 atmospheres, is 400 gf/in or greater, wherein the first adhesive layer comprises a first adhesive composition comprising a copolymer of a diene and an olefin-based compound comprising one carbon-carbon double bond, wherein the second adhesive layer comprises a second adhesive composition comprising;

a polymer comprising a polymerization unit of an alkyl (meth)acrylate, a hard comonomer and a crosslinkable monomer, wherein the polymer comprises 80-95 parts by weight of alkyl (meth)acrylate, 1-30 parts by weight of hard comonomer, and 1-40 parts by weight of crosslinkable monomer on the basis of 100 parts by weight of the polymer, wherein a total amount of the alkyl (meth)acrylate, the hard comonomer, and the crosslinkable monomer is 100 parts by weight, and a polymer comprising a unit derived from a silicon-based hydrophobic monomer, wherein the polymer comprising a unit derived from a silicon-based hydrophobic monomer is included in 0.01 parts by weight to 10 parts by weight based on 100 parts by weight of the second adhesive composition

TABLE 1

| | Example 1 | Example 2 | Example 3 | Example 4 | Compartive Example 1 | Comparative Example 2 | Comparative Example 3 |
|---|---|---|---|---|---|---|---|
| Initial Adhesive Strength (gf/in) | 21 | 16 | 27 | 22 | 175 | 24 | 690 |
| Adhesive Strength after Heat Treatment (gf/in) | 720 | 790 | 840 | 950 | 284 | 730 | 810 |
| Moisture Permeability (g/m² · 24 h) | 8 | 9 | 7 | 8 | 5 | 337 | 8 |
| Reliability | OK | OK | OK | OK | OK | NG | OK |
| Reworkability | OK | OK | OK | OK | NG | OK | NG |

According to Examples 1 to 4 of Table 1, it was seen that reworkability was excellent by having low initial adhesive strength, and adhesive strength was high after heat treatment, and reliability was satisfied by having low moisture permeability.

According to Comparative Example 1 of Table 1, it was seen that rework properties were not provided by having high initial adhesive strength before heat treatment.

According to Comparative Example 2 of Table 1, reliability was not satisfied due to insufficient moisture barrier properties, and a lifting phenomenon was observed.

According to Comparative Example 3 of Table 1, it was seen that rework properties were not obtained by having high initial adhesive strength.

The invention claimed is:

1. An adhesive sheet comprising a first adhesive layer and a second adhesive layer consecutively provided on a barrier film, wherein the first adhesive layer is provided on a barrier layer of the barrier film, wherein an initial adhesive strength between the second adhesive layer and a SUS304 substrate is 200 gf/in or less, and an adhesive strength between the second wherein the adhesive sheet has a moisture permeability (WVTR) of 10 g/m²·24 h or less, as measured in accordance with ASTM F1249.

2. The adhesive sheet of claim 1, wherein the barrier film has a structure in which a base layer, a planarization layer and the barrier layer are laminated.

3. The adhesive sheet of claim 1, wherein the first adhesive composition further comprises a tackifier and a curable resin.

4. An organic electronic device encapsulation product comprising the adhesive sheet of claim 1.

5. A method for manufacturing the adhesive sheet according to claim 1 comprising:

preparing the barrier film; and sequentially forming the first adhesive layer and the second adhesive layer on the barrier layer of the barrier film to form the adhesive sheet, wherein the first adhesive layer is provided on the barrier layer of the barrier film.

* * * * *